(12) United States Patent
Park et al.

(10) Patent No.: US 12,507,553 B2
(45) Date of Patent: Dec. 23, 2025

(54) DISPLAY DEVICE

(71) Applicant: Samsung Display Co., Ltd., Yongin-si (KR)

(72) Inventors: Jongwon Park, Yongin-si (KR); Hyunwoong Kim, Yongin-si (KR); Seungkyu Lee, Yongin-si (KR); Seoni Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/735,017

(22) Filed: Jan. 6, 2020

(65) Prior Publication Data

US 2020/0295117 A1   Sep. 17, 2020

(30) Foreign Application Priority Data

Mar. 12, 2019   (KR) .......... 10-2019-0028156

(51) Int. Cl.
*H10K 59/131* (2023.01)

(52) U.S. Cl.
CPC .............. *H10K 59/1315* (2023.02)

(58) Field of Classification Search
CPC .......... G02F 1/136286; G02F 1/13452; G02F 1/13454; G02F 2001/133388; G02F 2001/13606; G02F 2001/136272; H01L 27/3276; H01L 27/3288; H01L 23/49; H01L 23/528; G09G 2300/0426; G09G 3/3275; G09G 2310/0281; G09G 2320/0209; G09G 2320/0233; H05K 1/0216; H05K 1/0265; H10K 59/1315
See application file for complete search history.

(56) References Cited

U.S. PATENT DOCUMENTS

| | | | |
|---|---|---|---|
| 9,287,329 B1 | 3/2016 | Lee et al. | |
| 9,985,053 B2 | 5/2018 | Kim et al. | |
| 10,586,841 B2 | 3/2020 | Moon et al. | |
| 10,644,091 B2 | 5/2020 | Liu et al. | |
| 2005/0098785 A1 | 5/2005 | You | |
| 2006/0232738 A1 | 10/2006 | Lin et al. | |

(Continued)

FOREIGN PATENT DOCUMENTS

| | | |
|---|---|---|
| CN | 108493226 | 9/2018 |
| CN | 108695367 | 10/2018 |

(Continued)

*Primary Examiner* — Eric K Ashbahian
(74) *Attorney, Agent, or Firm* — Sughrue Mion, PLLC

(57) ABSTRACT

A display device includes: a substrate including a display area and a peripheral area at least partially surrounding the display area; a plurality of scan lines extending in a first direction in the display area; a plurality of data lines extending in a second direction intersecting the first direction in the display area; and a plurality of fan-out regions located in the peripheral area, each of the plurality of fan-out regions including fan-out lines electrically connected to the plurality of data lines, wherein in at least some of the plurality of fan-out regions, the fan-out lines include first fan-out lines and second fan-out lines alternately arranged and located on different layers, and where the outermost fan-out lines of first and second fan-out regions that are adjacent to each other are either first fan-out lines or second fan out lines.

16 Claims, 5 Drawing Sheets

(56) References Cited

U.S. PATENT DOCUMENTS

| | | | | |
|---|---|---|---|---|
| 2007/0002243 | A1* | 1/2007 | Kim | G02F 1/13452 |
| | | | | 349/139 |
| 2008/0129944 | A1* | 6/2008 | Park | G02F 1/1345 |
| | | | | 349/150 |
| 2010/0025690 | A1 | 2/2010 | Kim et al. | |
| 2011/0075089 | A1 | 3/2011 | Jheng | |
| 2014/0117320 | A1* | 5/2014 | Jung | H01L 27/3276 |
| | | | | 257/40 |
| 2016/0141353 | A1 | 5/2016 | Kim et al. | |
| 2016/0307990 | A1* | 10/2016 | Kwon | H01L 27/1255 |
| 2017/0047347 | A1* | 2/2017 | Kim | G02F 1/1345 |
| 2017/0047356 | A1* | 2/2017 | Lee | G02F 1/136259 |
| 2017/0287936 | A1 | 10/2017 | Kim et al. | |
| 2017/0288008 | A1* | 10/2017 | Kim | H01L 51/0097 |
| 2018/0337226 | A1* | 11/2018 | Liu | H01L 51/5206 |
| 2019/0051668 | A1* | 2/2019 | Huang | H01L 27/124 |
| 2021/0200013 | A1* | 7/2021 | Li | H05K 1/11 |

FOREIGN PATENT DOCUMENTS

| | | |
|---|---|---|
| CN | 107112349 | 11/2020 |
| KR | 10-2006-0110200 | 10/2006 |
| KR | 10-2007-0002278 | 1/2007 |
| KR | 10-2008-0044503 | 5/2008 |
| KR | 10-2017-0020640 | 2/2017 |
| KR | 10-2018-0108271 | 10/2018 |

\* cited by examiner

DISPLAY DEVICE

CROSS-REFERENCE TO RELATED APPLICATION

This application claims priority from and the benefit of Korean Patent Application No. 10-2019-0028156, filed on Mar. 12, 2019, which is hereby incorporated by reference for all purposes as if fully set forth herein.

BACKGROUND

Field

Exemplary implementations of the invention relate to a display device and, more particularly, to a display device having data fan-out units that minimize signal interference.

Discussion of the Background

As the display field, which visually expresses various types of electrical signal information such as data and images, develops rapidly, various flat display devices having excellent characteristics such as a slim profile, lightweight, and low power consumption have been introduced, and the resolution of these display devices also has increased.

When the resolution of a display device is increased, the number of wirings that transfer an electric signal to the display area inevitably increases, and as a result, image quality of the display device may be reduced due to unintended coupling (interference) that occurs when the spacing between neighboring wirings is reduced.

The above information disclosed in this Background section is only for understanding of the background of the inventive concepts, and, therefore, it may contain information that does not constitute prior art.

SUMMARY

Applicant discovered that interference between signal wires in a display device, such as data fan-out lines, can be reduced or prevented by disposing adjacent signal lines in different layers. Applicant also discovered that disposing the outermost lines of adjacent data fan-out units in the same layer can result in undesirable deviations, e.g., in brightness.

Display devices constructed according to the principles and exemplary implementations of the invention provide excellent image quality and prevents or reduces the occurrence of interference between wirings that transfer an electric signal to a display area. For example, according to one or more exemplary implementations, at least some of fan-out units, which apply an electric signal to the display area include first fan-out lines and second fan-out lines located on different layers and alternately arranged, thereby reducing or preventing interference between the fan-out lines.

Also, according to one or more exemplary implementations, the outermost fan-out lines disposed in two adjacent fan-out units adjacent and respectively to each other include first fan-out lines or second fan-out lines located on the same layer, thereby minimizing or preventing the occurrence of a brightness deviation in the display device.

Additional features of the inventive concepts will be set forth in the description which follows, and in part will be apparent from the description, or may be learned by practice of the inventive concepts.

According to one or more embodiments, a display device includes: a substrate including a display area and a peripheral area at least partially surrounding the display area; a plurality of scan lines extending in a first direction in the display area; a plurality of data lines extending in a second direction intersecting the first direction in the display area; and a plurality of fan-out regions located in the peripheral area, each of the plurality of fan-out regions including fan-out lines electrically connected to the plurality of data lines, where, in at least some of the plurality of fan-out regions, the fan-out lines include first fan-out lines and second fan-out lines alternately arranged and located on different layers, and where the outermost fan-out lines of first and second fan-out regions that are adjacent to each other are either first fan-out lines or second fan out lines.

The first fan-out lines and the second fan-out lines included in two adjacent ones of the fan-out regions are arranged to be symmetric to each other with respect to the neighboring to outermost fan-out lines.

At least some of the plurality of fan-out regions include fan-out units having a contact unit that is adjacent to the display area, a pad unit located opposite to the contact unit, and an extension unit disposed between the contact unit and the pad unit, and the extension unit may include a first region, a second region and a third region with the second region being disposed between the first region and the third region, and at least some of the plurality of fan-out units including a bent pattern in the first region.

The second region and the third region may have different shapes.

A plurality of pixels may be arranged in the display area, the plurality of pixels being electrically connected to the plurality of scan lines and the plurality of data lines, and each of the plurality of pixels may include a pixel circuit including a thin film transistor, and a light-emitting element electrically connected to the thin film transistor.

The thin film transistor may include an active layer, a gate electrode, a source electrode, and a drain electrode, a first gate insulating layer may be arranged between the active layer and the gate electrode, a second gate insulating layer may be arranged between the gate electrode, the source electrode, and the drain electrode, and each of the first gate insulating layer and the second gate insulating layer may extend to the peripheral area and include an inorganic material.

The gate electrode and the first fan-out lines may be arranged on the same layer and may include substantially the same material.

The second fan-out lines may be arranged on the second gate insulating layer.

The display device may further include an interlayer insulating layer disposed on the second fan-out lines, where the source electrode and the drain electrode may be arranged on the interlayer insulating layer in the display area.

The light-emitting element may include an organic light-emitting diode.

According to one or more embodiments, a display device includes: a substrate including a display area and a peripheral area at least partially surrounding the display area; a plurality of pixels arranged in the display area; and a plurality of fan-out regions located in the peripheral area, each of the plurality of fan-out regions including fan-out lines, where, in each of the plurality of fan-out regions, the fan-out lines include first fan-out lines and second fan-out lines alternately arranged and located on different layers, each of the plurality of pixels includes a thin film transistor including an active layer, a gate electrode, a source electrode, and a drain electrode, a first gate insulating layer and a second gate insulating layer extending to the peripheral area, the first gate insulating layer being disposed between the active layer and the gate electrode, and the second gate insulating layer being disposed between the gate electrode and the source electrode and the drain electrode and the first fan-out lines are arranged on the first gate insulating layer, and the second fan-out lines are arranged on the second gate insulating layer.

The outermost fan-out lines of first and second fan-out regions that are adjacent to each other are both either first fan-out lines or second fan-out lines.

The first fan-out lines and the second fan-out lines included in the two adjacent fan-out regions may be arranged to be symmetric to each other with respect to the adjacent outermost fan-out lines.

The gate electrode and the first fan-out lines may be arranged on the same layer and may include the same material.

The display device may further include an interlayer insulating layer disposed on the second fan-out lines, and the source electrode and the drain electrode may be arranged on the interlayer insulating layer in the display area.

The display device may further include: a plurality of scan lines extending in a first direction and a plurality of data lines extending in a second direction intersecting the first direction in the display area, wherein the plurality of fan-out lines may be electrically connected to the plurality of data lines.

At least some of the plurality of fan-out regions may include a contact unit that is adjacent to the display area, a pad unit located opposite to the contact unit, and an extension unit disposed between the contact unit and the pad unit, the extension unit may include a first region, a second region and a third region, with the second region being disposed between the first region and the third region, and the plurality of fan-out regions may include a bent pattern in the first region.

The second region and the third region may have different shapes.

Each of the plurality of pixels may include an organic light-emitting diode electrically connected to the thin film transistor.

The fan-out regions may include fan-out units

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
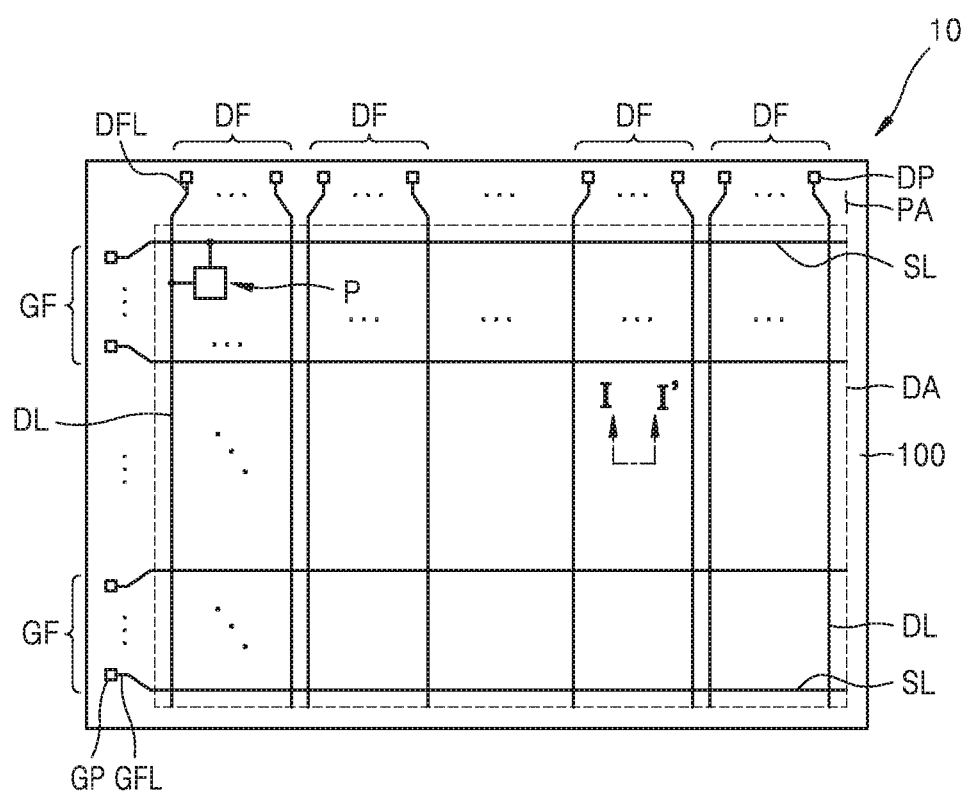
FIG. 1 is a plan view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the disclosure will be described more fully with reference to the accompanying drawings, in which example embodiments of the invention are shown. When description is made with reference to the drawings, like reference numerals in the drawings denote like or corresponding elements.

Figure 2:
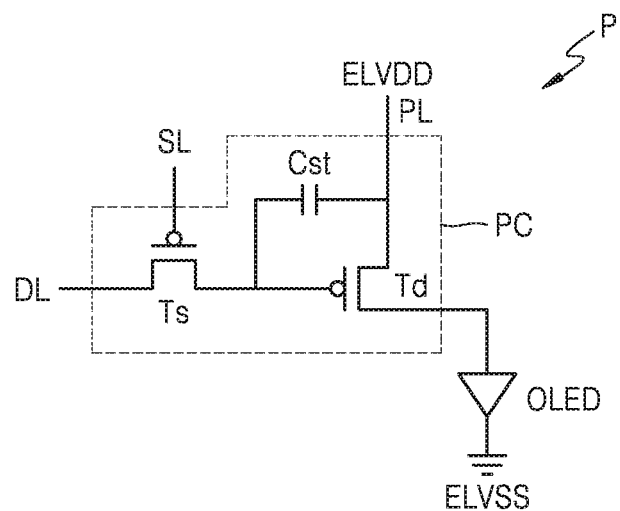
FIG. 2 is an equivalent circuit diagram of one representative (sub) pixel of the display device of FIG. 1.

FIG. 1 is a plan view of an exemplary embodiment of a display device 10 constructed according to the principles of the invention, and FIG. 2 is an equivalent circuit diagram of one representative (sub) pixel of the display device 10 of FIG. 1.

Referring to FIG. 1, the display device 10 according to an exemplary embodiment includes a display area DA in which an image is displayed and a peripheral area PA outside the display area DA. It may be understood that a substrate 100 includes the display area DA and the peripheral area PA.

A plurality of scan lines SL extending in a first direction and a plurality of data lines DL extending in a second direction intersecting with the first direction may be arranged in the display area DA. A plurality of data fan-out units DF and a plurality of gate fan-out units GF may be arranged in the peripheral area PA. The data fan-out units may be arranged in a row extending generally parallel to the scan lines, while the gate fan-out units may be arranged in a column extending generally parallel to the date lines Each of the data fan-out units DF includes a plurality of data fan-out lines DFL. One end of each of the data fan-out lines DFL is electrically connected to a corresponding data pad DP, and the other end thereof is electrically connected to a corresponding data line DL. The spacing (pitch) between the data fan-out lines DFL of each data fan-out unit DF narrows toward the data pad DP from the data line DL.

An external device such as a driving integrated circuit may be electrically connected to the data pad DP. For example, a driving integrated circuit including a data driver may be bonded with the data pads DP in a chip on glass (COG) method and mounted in the peripheral area PA of the substrate 100. As another example, the data pad DP may be connected to a flexible printed circuit board in which a driving integrated circuit is arranged.

Each of the gate fan-out units GF includes a plurality of gate fan-out lines GFL. One end of each of the gate fan-out lines GFL is electrically connected to a corresponding gate pad GP, and the other end thereof is electrically connected to a corresponding gate line GL. The spacing (pitch) between the gate fan-out lines GFL of each gate fan-out unit GF narrows toward the gate pad GP from the gate line DL.

An external device such as a driving integrated circuit may be electrically connected to the gate pad GP. For example, a driving integrated circuit including a gate driver may be bonded with the gate pads GP in a chip on glass (COG) method and mounted in the peripheral area PA of the substrate 100. As another example, the gate pad GP may be connected to a flexible printed circuit board in which a driving integrated circuit has been arranged.

A plurality of (sub) pixels P are formed in a portion of the display area DA where the data line DL and the gate line GL intersect with each other, the (sub) pixels P being electrically connected to the data line DL and the gate line GL.

FIG. 2 shows an example of an equivalent circuit diagram of one (sub) pixel P. Referring to FIG. 2, the (sub)-pixel P may include a pixel circuit PC and a light-emitting element, the pixel circuit PC being connected to a scan line SL and a data line DL, and the light-emitting element being connected to the pixel circuit PC. The light-emitting element may include an organic light-emitting diode OLED, for example.

The pixel circuit PC may include a driving thin film transistor Td, a switching thin film transistor Ts, and a storage capacitor Cst. The switching thin film transistor Ts may be connected to the scan line SL and the data line DL and may transfer a data signal input through the data line DL to the driving thin film transistor Td in response to a scan signal input through the scan line SL. The storage capacitor Cst may be connected to the switching thin film transistor Ts and a driving voltage line PL and may store a voltage corresponding to a difference between a voltage transferred from the switching thin film transistor Ts and a driving voltage ELVDD supplied to the driving voltage line PL.

The driving thin film transistor Td may be connected to the driving voltage line PL and the storage capacitor Cst and may control a driving current flowing through an organic light-emitting diode OLED from the driving voltage line PL in response to the voltage stored in the storage capacitor Cst. The organic light-emitting diode OLED may emit light having predetermined brightness by using the driving current. The organic light-emitting diode OLED may emit, for example, red, green, blue, or white light.

Though FIG. 2 shows the case where one (sub) pixel P includes two thin film transistors and one storage capacitor, the exemplary embodiments are not limited thereto. In another exemplary embodiment, the pixel circuit PC of the (sub) pixel P may include three or more thin film transistors or two or more storage capacitors. Various modifications may be made.

Figure 3:
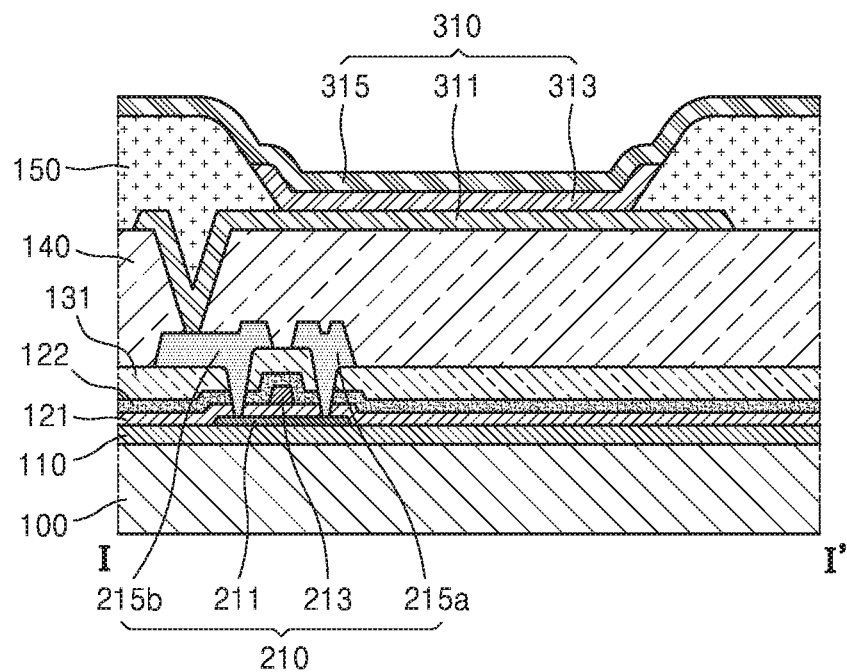
FIG. 3 is an exemplary cross-sectional view taken along line I-I' of FIG. 1.

FIG. 3 is an exemplary cross-sectional view taken along line I-I' of FIG. 1. Hereinafter, a structure of one (sub) pixel is described in detail with reference to FIG. 3.

Referring to FIG. 3, a thin film transistor 210 and a light-emitting element 310 may be arranged over the substrate 100, the light-emitting element 310 being electrically connected to the thin film transistor 210. For example, the light-emitting element 310 may include an organic light-emitting diode OLED, and the thin film transistor 210 may correspond to the driving thin film transistor Td (see FIG. 2) of the pixel circuit PC (see FIG. 2) described with reference to FIG. 2. Though FIG. 3 shows only one thin film transistor 210, for convenience of description, the switching thin film transistor Ts (see FIG. 2) and the storage capacitor Cst (see FIG. 2) described with reference to FIG. 2 are formed over the substrate 100.

The substrate 100 may include various materials such as a plastic material including polyethylene terephthalate (PET), polyethylene naphthalate (PEN), and polyimide (PI). For example, the substrate 100 may include various flexible or bendable materials. The substrate 100 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 may include a multi-layer including two layers and a barrier layer, the two layers respectively including these polymer resins, the barrier layer including an inorganic material between the two layers, and the inorganic material including $SiO_x$, $SiN_x$, and SiON. The substrate 100 may be variously modified.

A buffer layer 110 may be arranged on the substrate 100. The buffer layer 110 may provide a flat surface on the substrate 100 and block foreign substance, etc. penetrating through the substrate 100. For example, the buffer layer 110 may include an inorganic material such as silicon oxide, silicon nitride, silicon oxynitride, aluminum oxide, aluminum nitride, titanium oxide, or titanium nitride, or an organic material such as polyimide, polyester, and acrylic. The buffer layer 110 may include a stacked body including a plurality of the above exemplary materials.

The thin film transistor 210 may include an active layer 211, a gate electrode 213, a source electrode 215a, and a drain electrode 215b. Hereinafter, the description is directed to the exemplary case in which the thin film transistor 210 is a top-gate type thin film transistor in which the active layer 211, the gate electrode 213, the source electrode 215a, and the drain electrode 215b are sequentially formed. However, the exemplary embodiments are not limited thereto and various types of thin film transistors 210 such as a bottom-gate type thin film transistor may be implemented.

The active layer 211 may include a semiconductor material such as amorphous silicon or polycrystalline silicon. However, the exemplary embodiments are not limited thereto and the active layer 211 may include various materials. In an exemplary embodiment, the active layer 211 may include an organic semiconductor material. In another exemplary embodiment, the active layer 211 may include an oxide semiconductor material. For example, the active layer 211 may include Groups 12, 13, and 14 metal elements such as Zn, In, Ga, Sn, Cd, Ge, and an oxide of a material of combination of these.

A first gate insulating layer 121 is arranged on the active layer 211. The first gate insulating layer 121 may include a single layer or a multi-layer including an inorganic material such as silicon oxide, silicon nitride and/or silicon oxynitride. The first gate insulating layer 121 may insulate the active layer 211 from the gate electrode 213 and extend to not only the display area DA but also to the peripheral area PA.

The gate electrode 213 is arranged on the first gate insulating layer 121. The gate electrode 213 may be connected to a gate line that applies an on/off signal to the thin film transistor 210. The gate electrode 213 may include a low-resistance metal material. For example, the gate electrode 213 may include a single layer or a multi-layer including at least one of Al, Pt, Pd, Ag, Mg, Au, Ni, Nd, Ir, Cr, Li, Ca, Mo, Ti, W, and Cu.

A second gate insulating layer 122 is arranged on the gate electrode 213. The second gate insulating layer 122 may include a single layer or a multi-layer including an inorganic material such as silicon oxide, silicon nitride and/or silicon oxynitride and extend to the peripheral area PA.

An interlayer insulating layer 131 disposed on the second gate insulating layer 122 may extend to not only the display area DA but also to the peripheral area PA. The interlayer insulating layer 131 may include a single layer or a multi-layer including an inorganic material. For example, the inorganic material may include a metal oxide or a metal nitride. Specifically, the inorganic material may include $SiO_2$, $SiN_x$, SiON, $Al_2O_3$, $TiO_2$, $Ta_2O_5$, $HfO_2$, or $ZrO_2$.

The source electrode 215a and the drain electrode 215b are arranged on the interlayer insulating layer 131. That is, the second gate insulating layer 122 and the interlayer insulating layer 131 insulate the source electrode 215a and the drain electrode 215b from the gate electrode 213.

The source electrode 215a and the drain electrode 215b may include a single layer or a multi-layer including at least one of Al, Pt, Pd, Ag, Mg, Au, Ni, Nd, Ir, Cr, Li, Ca, Mo, Ti, W, and Cu. For example, the source electrode 215a and the drain electrode 215b may have a three-layered stack structure including Ti, Al, and Ti.

The source electrode 215a and the drain electrode 215b may be respectively connected to a source region and a drain region of the active layer 211 through contact holes formed in the first gate insulating layer 121, the second gate insulating layer 122, and the interlayer insulating layer 131.

A planarization layer 140 is arranged on the source electrode 215a and the drain electrode 215b. The planarization layer 140 prevents a defect from occurring to the light-emitting element 310 by resolving a step difference in height due to the thin film transistor 210. The planarization layer 140 may include a single layer or a multi-layer including an organic material. The organic material may include a general-purpose polymer such as polymethylmethacrylate (PMMA) and polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The light-emitting element 310 may be arranged on the planarization layer 140, the light-emitting element 310 including a pixel electrode 311, a common electrode 315, and an intermediate layer 313, and the intermediate layer 313 being arranged between the pixel electrode 311 and the common electrode 315 and including an emission layer. For example, the light-emitting element 310 may include an organic light-emitting diode.

The pixel electrode 311 may be arranged on the planarization layer 140 and electrically connected to the thin film transistor 210 thereunder through a contact hole formed in the planarization layer 140. The pixel electrode 311 may have various shapes and, for example, may be patterned in an island-type shape by photolithography.

The pixel electrode 311 may include, for example, a reflective electrode. For example, the pixel electrode 311 may include a reflective layer and a transparent or semi-transparent electrode layer disposed on the reflective layer, the reflective layer including at least one of Ag, Mg, Pt, Pd, Au, Ni, Nd, Ir, Cr, and a compound thereof. The transparent or semi-transparent electrode layer may include at least one of ITO, IZO, ITZO, GZO, and IGZO.

For example, the pixel electrode 311 may have a stacked structure including a first conductive layer, which is a transparent or semi-transparent electrode layer, a second conductive layer including Ag, and a third conductive layer, which is a transparent or semi-transparent electrode layer. Also, the second conductive layer including Ag may further include an alloy element having an atomic radius that is the same as or less than that of Ag so as to prevent cohesion of Ag. The alloy element may include at least one of Zn, Ni, Co, Cu, Ga, Ge, Pt, Sb, Mn, W, and Mo.

A pixel-defining layer 150 is formed on the planarization layer 140, the pixel-defining layer 150 covering edges of the pixel electrode 311. The pixel-defining layer 150 defines a pixel by including an opening corresponding to each pixel, that is, an opening that exposes at least a central portion of the pixel electrode 311. Also, the pixel-defining layer 150 may prevent an arc, etc. from occurring between the edges of the pixel electrode 311 and the common electrode 315 by increasing a distance between the edges of the pixel electrode 311 and the common electrode 315. The pixel-defining layer 150 may include at least one organic insulating material including polyimide, polyamide, an acrylic resin, benzo cyclo butane, and a phenolic resin and may be formed by spin coating.

The intermediate layer 313 may be arranged on a portion of the pixel electrode 311 exposed through the opening of the pixel-defining layer 150. The intermediate layer 313 may include a low molecular weight or polymer material. In the case where the intermediate layer 313 includes a low molecular weight material, the intermediate layer 313 may have a structure in which a hole injection layer (HIL), a hole transport layer (HTL), an emission layer (EML), an electron transport layer (ETL), an electron injection layer (EIL), etc. are stacked in a single or a composite configuration. The intermediate layer 313 may include various organic materials such as copper phthalocyanine (CuPc), N,N'-Di(naphthalene-1-yl)-N,N'-diphenyl-benzidine (NPB), and tris-8-hydroxyquinoline aluminum (Alq3). These layers may be formed by vacuum deposition.

In the case where the intermediate layer 313 includes a polymer material, the intermediate layer 313 may have a structure including an HTL and an EML. In this case, the HTL may include PEDOT, and the EML may include a polymer material such as a polyphenylene vinylene (PPV)-based material and a polyfluorene-based material. The structure of the intermediate layer 313 is not limited thereto and may be variously modified. For example, the intermediate layer 313 may include a layer which is one body over the plurality of pixel electrodes 311, or include a patterned layer corresponding to each of the plurality of pixel electrodes 311.

The common electrode 315 may be arranged to cover the display area DA. That is, the common electrode 315 may be provided as one body to cover the plurality of light-emitting elements 310. The common electrode 315 may include a transparent or semi-transparent electrode and include a metal thin layer having a small work function and including at least one of Li, Ca, LiF/Ca, LiF/Al, Al, Ag, Mg, and a compound thereof. Also, an auxiliary electrode layer or a bus electrode including a material for a transparent electrode may be further formed on the metal thin layer, the material for the transparent electrode including ITO, IZO, ZnO, or $In_2O_3$. Therefore, the common electrode 315 may transmit light emitted from the organic emission layer included in the intermediate layer 313. That is, the light emitted from the organic emission layer may be directly emitted to the common electrode 315, or reflected by the pixel electrode 311 including the reflective electrode and then emitted to the common electrode 315.

However, the display device 10 of FIG. 1 according to the illustrated exemplary embodiment is not limited to a top-emission type display device and may be a bottom-emission type display device in which light emitted from the organic emission layer is emitted to the substrate 100. In this case, the pixel electrode 311 may include a transparent or semi-transparent electrode, and the common electrode 315 may include a reflective electrode. Also, the display device 10 of FIG. 1 may be a dual emission-type display device which emits lights in two directions including a top side and a bottom side.

Figure 4:
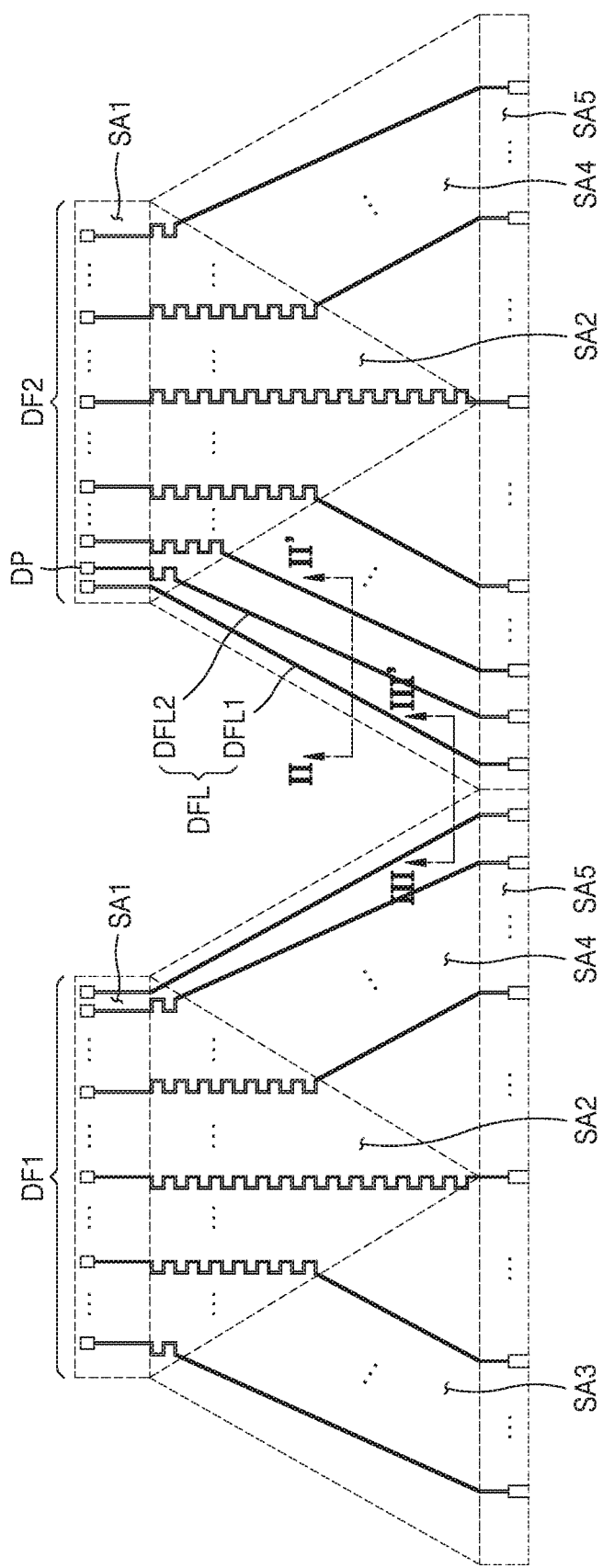
FIG. 4 is an enlarged plan view of a first fan-out unit and an adjacent second fan-out unit of the display device of FIG. 1.
Figure 5:
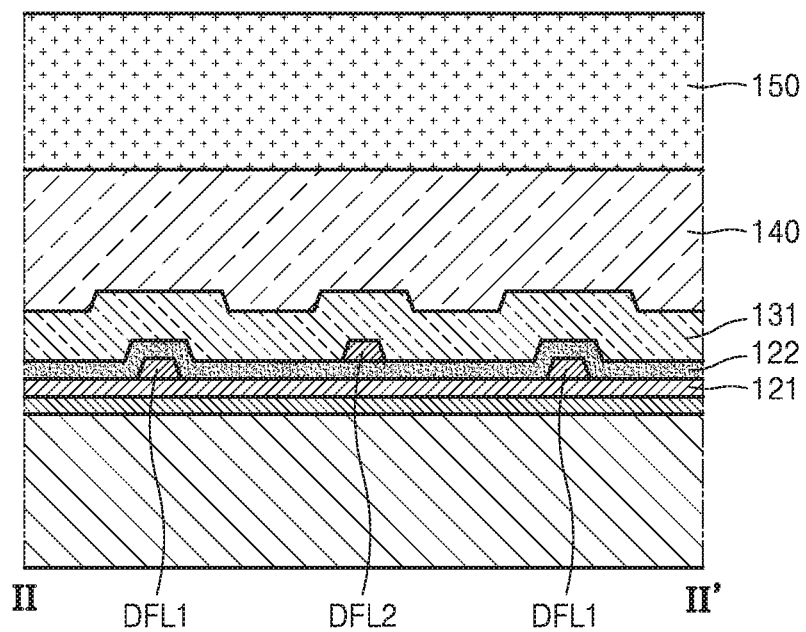
FIG. 5 is a cross-sectional view of an example of a cross-section taken along line II-II' of FIG. 4.
Figure 6:
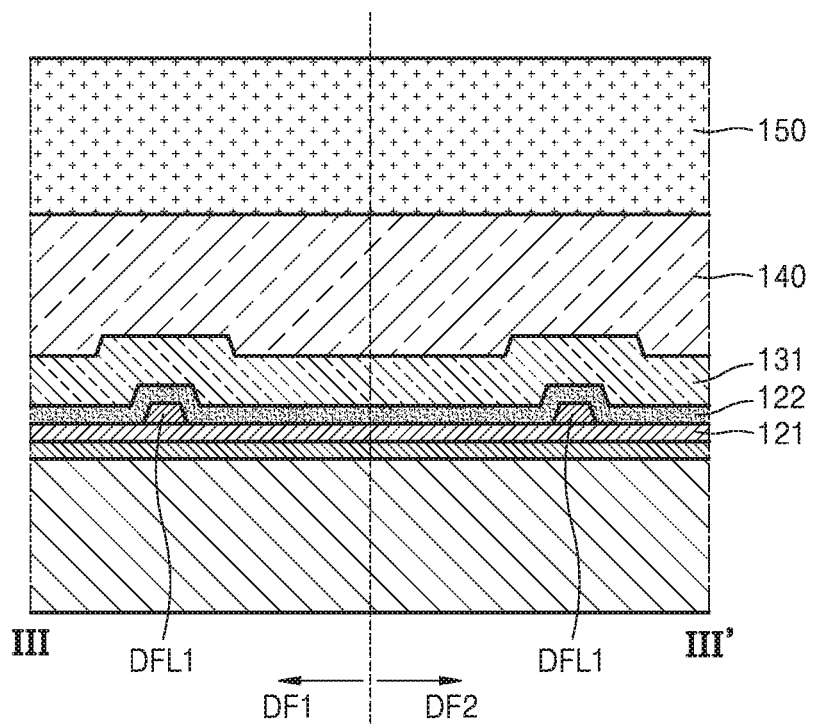
FIG. 6 is a cross-sectional view of an example of a cross-section taken along line III-III' of FIG. 4.

FIG. 4 is an enlarged plan view of a first fan-out unit and an adjacent second fan-out unit of the display device 10 of FIG. 1, FIG. 5 is a cross-sectional view of an example of a cross-section taken along line II-II' of FIG. 4, and FIG. 6 is a cross-sectional view of an example of a cross-section taken along line III-III' of FIG. 4.

FIG. 4 shows a first data fan-out unit DF1 and a second data fan-out unit DF2 that are adjacent to each other. The first data fan-out unit DF1 and the second data fan-out unit DF2 denote two data fan-out units DF that are adjacent to each other among the plurality of data fan-out units DF shown in FIG. 1. Also, though the second data fan-out unit DF2 is described below, the description is applicable to the first data fan-out unit DF1.

A plurality of data fan-out lines DFL are arranged in the second data fan-out unit DF2. One end of each data fan-out line DFL is connected to one of the data pads DP, and the other end thereof is connected to the data line DL (see FIG. 1).

The data fan-out lines DFL are spaced apart from each other in a data fan-out region. The data fan-out region may include a pad unit SA1, a contact unit SA5, and an extension unit. The extension unit may include a first region SA2, a second region SA3, and a third region SA4. Though it is shown in FIG. 4 that the second region SA3 and the third region SA4 have the same shape, the exemplary embodiments are not limited thereto. That is, the second region SA3 and the third region SA4 may have different shapes or different areas.

The contact unit SA5 may be adjacent to the display area DA (see FIG. 1), and a plurality of data pads DP are arranged in the pad unit SA1 located opposite to the contact unit SA5.

The first region SA2, the second region SA3, and the third region SA4 are arranged between the pad unit SA1 and the contact unit SA5. The second region SA3 and the third region SA4 are arranged on two opposite sides of the first region SA2. In the drawing, the second region SA3 and the third region SA4 may have a triangle shape, and the first region SA2 may have an inverted triangle shape.

The data fan-out lines DFL may be connected to the data pads DP in the pad unit SA1 and arranged such that the spacing (pitch) between the data fan-out lines DFL is constant.

The data fan-out lines DFL extend from the pad unit SA1 to the first region SA2. In the first region SA2, the data fan-out lines DFL are arranged such that the pitch between the data fan-out lines DFL is approximately constant.

Meanwhile, since the pitch between the data pads DP is less than the pitch between the data lines DL (see FIG. 1) of the display area DA (see FIG. 1), the data fan-out lines DFL spread and extend in an oblique direction in the second region SA3 and the third region SA4. The pitch between the data fan-out lines DFL increases toward the contact unit SA5 in the second region SA3 and the third region SA4. As a result, a length of the data fan-out lines DFL may increase toward an outer side of a second data fan-out unit DF2 from the center of the second data fan-out unit DF2.

Therefore, a difference in resistance between the data fan-out lines DFL may occur depending on a location of the second data fan-out unit DF2. To prevent this, the data fan-out lines DFL may include a bent pattern in the first region SA2. For example, the pattern may include a zigzag pattern. Also, the difference in resistance between the data fan-out lines DFL may be reduced by increasing the number of bendings of a pattern toward the center of the first region SA2 from the edge of the first region SA2.

The data fan-out lines DFL may include first data fan-out lines DFL1 and second data fan-out lines DFL2 that are alternately arranged. In this case, the first data fan-out line DFL1 and the second data fan-out line DFL2 may be located on different layers as shown in FIG. 5.

For example, the first data fan-out line DFL1 may be located on the first gate insulating layer 121, and the second data fan-out line DFL2 may be located on the second gate insulating layer 122 covering the first data fan-out lines DFL1. That is, the first data fan-out line DFL1 and the gate electrode 213 (see FIG. 3) may be simultaneously formed from the same material. The interlayer insulating layer 131, the planarization layer 140, and the pixel-defining layer 150 may be sequentially stacked on the second data fan-out line DFL2.

When the first data fan-out lines DFL1 and the second data fan-out lines DFL2 that are alternately arranged are located on different layers as described above, since the pitch between the first data fan-out line DFL1 and the second data fan-out line DFL2 may be reduced compared to the case where the first data fan-out line DFL1 and the second data fan-out line DFL2 are located on the same layer, even though the number of first data fan-out lines DFL1 and second data fan-out lines DFL2 increases, the occurrence of a short-circuit and interference between the first data fan-out line DFL1 and the second data fan-out line DFL2 that are adjacent to each other may be prevented or minimized.

The first fan-out lines DFL1 and the second fan-out lines DFL2 located on different layers mean that the first fan-out lines DFL1 and the second fan-out lines DFL2 are formed by different processes. This means that the resistance of the first data fan-out line DFL1 and the resistance of the second data fan-out line DFL2 may be different in that thicknesses, etc. of the first fan-out lines DFL1 and the second fan-out lines DFL2 are different due to a deviation between processes of forming the first fan-out lines DFL1 and the second fan-out lines DFL2.

Also, as described above, the second region SA3 and the third region SA4 may have different shapes. For example, due to reasons of arrangement, etc. of other elements included in the display device 10 (see FIG. 1), when the locations of the pad unit SA1 of the first data fan-out unit DF1 and/or the pad unit SA1 of the second data fan-out unit DF2 are moved, since the location of the contact unit SA5 does not change, the second region SA3 and the third region SA4 may have different shapes in the first data fan-out unit DF1 and/or the second data fan-out unit DF2. With this configuration, the length of an outermost data fan-out line DFL that is most adjacent to the second data fan-out unit DF2 among the data fan-out lines DFL of the first data fan-out unit DF1, and the length of an outermost data fan-out line DFL that is most adjacent to the first data fan-out unit DF1 among the data fan-out lines DFL of the second data fan-out unit DF2 may be different from each other.

Under this state, when the outermost data fan-out line DFL of the first data fan-out unit DF1 that is most adjacent to the second data fan-out unit DF2 and the outermost data fan-out line DFL of the second data fan-out unit DF2 that is most adjacent to the first data fan-out unit DF1 are formed on different layers, a difference in a resistance therebetween may increase even more, and a brightness difference between (sub) pixels P (see FIG. 1) may appear distinctly, the (sub) pixels receiving a data signal from two data lines DL (see FIG. 1) respectively connected to the outermost data fan-out lines DFL.

Therefore, as shown in FIG. 6, the forming of different resistances of the outermost data fan-out lines DFL during the manufacturing process may be prevented by locating the outermost data fan-out line DFL of the first data fan-out unit DF1 and the outermost data fan-out line DFL of the second data fan-out unit DF2 that are adjacent to each other in the same layer. With this configuration, even though lengths of the outermost data fan-out line DFL of the first data fan-out unit DF1 and the outermost data fan-out line DFL of the second data fan-out unit DF2 are formed differently, since a further increase of a difference in a resistance therebetween is prevented, the occurrence of a brightness difference in the display device 10 (see FIG. 1) may be minimized.

Although it is shown in FIG. 6 that a data fan-out line DFL that is most adjacent to the second data fan-out unit DF2 of the first data fan-out unit DF1 and a data fan-out line DFL that is most adjacent to the first data fan-out unit DF1 of the second data fan-out unit DF2 are first data fan-out lines DFL1, the exemplary embodiments are not limited thereto. That is, since outermost data fan-out lines DFL respectively included in the first data fan-out unit DF1 and the second data fan-out unit DF2 and adjacent to each other may be located on the same layer, they may be the second data fan-out lines DFL2.

Also, since the first fan-out lines DFL1 and the second fan-out lines DFL2 are alternately arranged and located on different layers in the first data fan-out unit DF1 and the second data fan-out unit DF2, the first fan-out lines DFL1 and the second fan-out lines DFL2 respectively in the first data fan-out unit DF1 and the second data fan-out unit DF2 may be symmetric to each other with respect to the outermost data fan-out lines that are adjacent to each other.

According to exemplary embodiments, since each of the plurality of fan-out units, which apply an electric signal to the display area DA, includes first fan-out lines and second fan-out lines located on different layers and alternately arranged, the occurrence of interference between the fan-out lines may be prevented or reduced.

Also, since outermost fan-out lines adjacent to each other and respectively included in two fan-out units adjacent to each other include first fan-out lines or second fan-out lines located on the same layer, the occurrence of a brightness deviation in a display device may be prevented or minimized. The scope of the invention not limited by or to these effects.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a display area and a peripheral area at least partially surrounding the display area;
a plurality of scan lines extending in a first direction in the display area;
a plurality of data lines extending in a second direction intersecting the first direction in the display area; and
a plurality of fan-out regions located in the peripheral area, each of the plurality of fan-out regions including fan-out lines electrically connected to the plurality of data lines,
wherein:
in first and second fan-out regions of the plurality of fan-out regions that are closest to each other, the fan-out lines in the first and second fan-out regions include first fan-out lines and second fan-out lines alternately located on different layers, the first fan-out lines being located on a first insulating layer and the second fan-out lines being located a second insulating layer that is different from the first insulating layer;
each of the first fan-out lines in the first and second fan-out regions has a first thickness and each of the second fan-out lines in the first and second fan-out regions has a second thickness, the first thickness and the second thickness being different from each other;
a first fan-out line of the first fan-out region and a last fan-out line of the second fan-out region are closest to each other, the first fan-out line of the first fan-out region and the last fan-out line of the second fan-out region are both either the first fan-out lines or the second fan-out lines and are located on a same layer;
the first fan-out line of the first fan-out region is equal in thickness to the last fan-out line of the second fan-out region;
at least some of the plurality of fan-out regions comprise a plurality of fan-out units having a contact unit that is adjacent to the display area, a pad unit located opposite to the contact unit, and an extension unit disposed between the contact unit and the pad unit;
the extension unit includes a first inverted triangular shaped region, a second triangular shaped region, and a third triangular shape region, with the first inverted triangular shape region being disposed between the second triangular shape region and the third triangular shape region;
the fan-out lines in the plurality of fan-out units have a bent pattern in the first inverted triangular shaped region; and
a single one of the fan-out lines is arranged on a center portion of, and extends through a lower vertex of, the first inverted triangular shaped region.

2. The display device of claim 1, wherein the first fan-out lines and the second fan-out lines included in two adjacent ones of the plurality of fan-out regions are arranged to be symmetric to each other with respect to the neighboring outermost fan-out lines.

3. The display device of claim 1, wherein
a plurality of pixels are arranged in the display area, the plurality of pixels being electrically connected to the plurality of scan lines and the plurality of data lines; and
each of the plurality of pixels includes a pixel circuit including a top-gate thin film transistor, and a light-emitting element electrically connected to the thin film transistor.

4. The display device of claim 3, wherein
the thin film transistor includes an active layer, a gate electrode, a source electrode, and a drain electrode,
a first gate insulating layer is arranged between the active layer and the gate electrode, a second gate insulating layer is arranged between the gate electrode and the source electrode and the drain electrode, and
each of the first gate insulating layer and the second gate insulating layer extends to the peripheral area and includes an inorganic material.

5. The display device of claim 4, wherein:
the first insulating layer comprises the first gate insulating layer; and
the gate electrode and the first fan-out lines are arranged on the first gate insulating layer and comprise substantially the same material.

6. The display device of claim 5, wherein:
the second insulating layer comprises the second gate insulating layer; and
the second fan-out lines are arranged on the second gate insulating layer.

7. The display device of claim 6, further comprising:
an interlayer insulating layer disposed on the second fan-out lines, wherein
the source electrode and the drain electrode are arranged on the interlayer insulating layer in the display area.

8. The display device of claim 3, wherein the light-emitting element comprises an organic light-emitting diode.

9. The display device of claim 1, wherein the first fan-out lines in the first fan-out region are equal in number to the first fan-out lines in the second fan-out region, and the second fan-out lines in the first fan-out region are equal in number to the second fan-out lines in the second fan-out region.

10. A display device comprising:
a substrate including a display area and a peripheral area at least partially surrounding the display area;
a plurality of pixels arranged in the display area; and
a plurality of fan-out regions located in the peripheral area, each of the plurality of fan-out regions including fan-out lines,
wherein:
in each of the plurality of fan-out regions, the fan-out lines include first fan-out lines and second fan-out lines alternately arranged and located on different layers, and a first fan-out line
of a first fan-out region and a last fan-out line of a second fan-out region are closest to each other, the first fan-out line of the first fan-out region and the last fan-out line of the second fan-out region are both either first fan-out lines or second fan-out lines and are located on a same layer;
each of the plurality of pixels includes a top-gate thin film transistor including an active layer, a gate electrode, a source electrode, and a drain electrode;
a first gate insulating layer and a second gate insulating layer extending to the peripheral area, the first gate insulating layer being disposed between the active layer and the gate electrode, and the second gate insulating layer being disposed between the gate electrode and the source electrode and the drain electrode;
the first fan-out lines are arranged on the first gate insulating layer, and the second fan-out lines are arranged on the second gate insulating layer;
each of the first fan-out lines in the first and second fan-out regions has a first thickness and each of the second fan-out lines in the first and second fan-out regions has a second thickness, the first thickness and the second thickness being different from each other; and the first fan-out line of the first fan-out region is equal in thickness to the last fan-out line of the second fan-out region at least some of the plurality of fan-out regions include a contact unit that is adjacent to the display area, a pad unit located opposite to the contact unit, and an extension unit disposed between the contact unit and the pad unit
the extension unit includes a first inverted triangular shape region, a second triangular shape region, and a third triangular shape region, with the first inverted triangular shape region being disposed between the second triangular shape region and the third triangular shape region;
the fan-out lines in the plurality of fan-out regions have a bent pattern in the first inverted triangular shaped region; and
a single one of the fan-out lines is arranged on a center portion of, and extends through a lower vertex of, the first inverted triangular shaped region.

11. The display device of claim 10, wherein the first fan-out lines and the second fan-out lines included in the two adjacent fan-out regions are arranged to be symmetric to each other with respect to the adjacent outermost fan-out lines.

12. The display device of claim 10, wherein the gate electrode and the first fan-out lines are arranged on the same layer and comprise the same material.

13. The display device of claim 10, further comprising: an interlayer insulating layer disposed on the second fan-outlines, wherein the source electrode and the drain electrode are arranged on the interlayer insulating layer in the display area.

14. The display device of claim 10, further comprising: a plurality of scan lines extending in a first direction and a plurality of datalines extending in a second direction intersecting the first direction in the display area, wherein
a plurality of fan-out lines are electrically connected to the plurality of data lines.

15. The display device of claim 10, wherein each of the plurality of pixels includes an organic light-emitting diode electrically connected to the thin film transistor.

16. The display device of claim 10, wherein the plurality of fan-out regions comprise fan-out units.

* * * * *